(12) United States Patent
Kim et al.

(10) Patent No.: US 9,160,275 B2
(45) Date of Patent: Oct. 13, 2015

(54) ENVELOPE DETECTION APPARATUS DYNAMICALLY CONTROLLED IN RESPONSE TO INPUT SIGNAL AND ENVELOPE DETECTION METHOD THEREOF

(71) Applicant: Samsung Electronics Co., Ltd., Suwon-si (KR)

(72) Inventors: Seong Joong Kim, Suwon-si (KR); Jae Sup Lee, Yongin-si (KR); Sang Gug Lee, Daejeon (KR); Jae Seung Lee, Daejeon (KR); Sok Kyun Han, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 71 days.

(21) Appl. No.: 13/683,439

(22) Filed: Nov. 21, 2012

(65) Prior Publication Data

US 2013/0194036 A1 Aug. 1, 2013

(30) Foreign Application Priority Data

Jan. 26, 2012 (KR) ........................ 10-2012-0007884

(51) Int. Cl.
*H03D 1/00* (2006.01)
*H03D 1/18* (2006.01)
*H03D 1/10* (2006.01)

(52) U.S. Cl.
CPC . *H03D 1/18* (2013.01); *H03D 1/00* (2013.01); *H03D 1/10* (2013.01)

(58) Field of Classification Search
CPC .... H04L 27/06; H03D 1/2236; H03D 1/2245; H03D 1/2254; H03D 2200/005; H03D 2200/0054; H03D 2200/0064; H03D 2200/0078; H03D 3/001; H03D 3/241; H03D 3/26; H03D 5/00; H03D 11/02; H03D 13/004; H03D 13/005; H03D 1/02; H03D 3/00; H03D 3/04; H03D 3/242; H03D 3/245; H03D 7/02; H03D 7/161; H03D 9/02; H03D 1/18
USPC .......... 329/347, 349, 353, 363; 375/320, 268; 455/334
See application file for complete search history.

(56) References Cited

U.S. PATENT DOCUMENTS 4,143,330 A * 3/1979 Nagasawa ..................... 329/369
4,370,620 A   1/1983 Tin (Continued)

FOREIGN PATENT DOCUMENTS

KR   10-2008-0055600 A   6/2008
KR   10-2009-0068339 A   6/2009
KR      10-1078843 B1    10/2011

*Primary Examiner* — Arnold Kinkead
(74) *Attorney, Agent, or Firm* — NSIP Law (57) ABSTRACT

An envelope detection apparatus dynamically controlled in response to an input signal and an envelope detection method thereof are provided. The envelope detection apparatus includes an envelope detector configured to output an envelope of an input signal. The envelope detection apparatus further includes a detection band determination unit configured to determine a detection band based on the input signal. The envelope detection apparatus further includes a detection band controller configured to control a detection band of the envelope detector based on the determined detection band.

22 Claims, 7 Drawing Sheets

(56) References Cited

U.S. PATENT DOCUMENTS 5,631,601 A * 5/1997 Horsfall et al. ............... 329/325
7,269,395 B2 9/2007 Choi et al.
7,302,055 B1 11/2007 Horwitz et al.
2012/0313698 A1* 12/2012 Ochoa et al. .................. 329/347

* cited by examiner

ENVELOPE DETECTION APPARATUS DYNAMICALLY CONTROLLED IN RESPONSE TO INPUT SIGNAL AND ENVELOPE DETECTION METHOD THEREOF

CROSS-REFERENCE TO RELATED APPLICATION(S)

This application claims the benefit under 35 U.S.C. §119 (a) of Korean Patent Application No. 10-2012-0007884, filed on Jan. 26, 2012, in the Korean Intellectual Property Office, the entire disclosure of which is incorporated herein by reference for all purposes.

BACKGROUND

1. Field

The following description relates to an envelope detection apparatus dynamically controlled in response to an input signal and an envelope detection method thereof.

2. Description of Related Art

An envelope detection apparatus detects an envelope of an input signal, namely, an envelope of an amplitude modulated input signal. The envelope detection apparatus includes a detection band. That is, when the input signal passes through the envelope detection apparatus, the envelope detection apparatus performs frequency filtering (for example, low-pass filtering), thereby outputting an envelope from the detection band.

SUMMARY

In one general aspect, there is provided an envelope detection apparatus including an envelope detector configured to output an envelope of an input signal. The envelope detection apparatus further includes a detection band determination unit configured to determine a detection band based on the input signal. The envelope detection apparatus further includes a detection band controller configured to control a detection band of the envelope detector based on the determined detection band.

The detection band controller may be further configured to generate a control signal to be provided to the envelope detector to control the detection band of the envelope detector based on the determined detection band.

The envelope detector may include a current source, and a capacitor. The detection band controller may be further configured to generate a control signal to control the current source or the capacitor based on the determined detection band.

The envelope detector may include a transistor configured to receive the input signal, a current source, and a capacitor. The current source and the capacitor may be connected to a node of the transistor to output the envelope. The current source and the capacitor may be connected in parallel.

The capacitor may include sub capacitors connected in parallel. The detection band controller may be further configured to generate a control signal to select at least one sub capacitor from the sub capacitors based on the determined detection band.

The at least one sub capacitor may be switched ON. Remaining sub capacitors of the sub capacitors may be switched OFF.

The current source may include sub current sources connected in parallel. The detection band controller may be further configured to generate a control signal to select at least one sub current source from the sub current sources based on the determined detection band.

The at least one sub current source may be switched ON. Remaining sub current sources of the sub current sources may be switched OFF.

The detection band controller may be further configured to generate a control signal to increase an effective capacitance of the capacitor, or to decrease an effective current of the current source, if a bandwidth of the detection band is to be decreased based on the determined detection band.

The detection band controller may be further configured to generate a control signal to decrease an effective capacitance of the capacitor, or to increase an effective current of the current source, if a bandwidth of the detection band of the envelope detector is to be increased based on the determined detection band.

The detection band controller may be further configured to generate a control signal to increase an effective current of the current source if a slew rate of the envelope detector is to be increased based on the determined detection band.

The detection band controller may be further configured to generate a control signal to decrease an effective current of the current source if a slew rate of the envelope detector is to be decreased based on the determined detection band.

The detection band determination unit may be further configured to determine the detection band based on a carrier frequency of the input signal, or a data transmission rate of the input signal, or a magnitude of the input signal, or any combination thereof.

The detection band determination unit may be further configured to determine the detection band to decrease the detection band of the envelope detector if a magnitude of the input signal is small.

The detection band determination unit may be further configured to determine the detection band to increase the detection band of the envelope detector if a magnitude of the input signal is large.

In another general aspect, there is provided an envelope detection apparatus including an envelope detector including a transistor configured to receive an input signal, a current source, and a capacitor, the current source and the capacitor being connected to a node of the transistor to output an envelope of the input signal. The envelope detection apparatus further includes a detection band determination unit configured to determine a detection band of the envelope detector based on the input signal. The envelope detection apparatus further includes a detection band controller configured to generate a control signal to control the current source or the capacitor in order to control a detection band of the envelope detector based on the determined detection band.

The transistor may include a n-channel metal oxide semiconductor (NMOS) transistor. The current source and the capacitor may be connected to a source node of the NMOS transistor. The envelope may include a voltage signal at the source node.

The current source may include sub current sources, and switches, each of the sub current sources being serially connected with each of the switches, respectively, and respective pairs of the sub current sources and the switches being connected in parallel. The detection band controller may be further configured to generate the control signal to selectively switch ON at least one switch of the switches based on the determined detection band.

The capacitor may include sub capacitors, and switches, each of the sub capacitor being serially connected with each of the switches, respectively, and respective pairs of the sub capacitors and the switches being connected in parallel. The detection band controller may be further configured to generate the control signal to selectively switch ON at least one switch of the switches based on the determined detection band.

The detection band determination unit may be further configured to determine the detection band based on a carrier frequency of the input signal, or a data transmission rate of the input signal, or a magnitude of the input signal, or any combination thereof.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses, and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, description of well-known functions and constructions may be omitted for increased clarity and conciseness.

Figure 1:
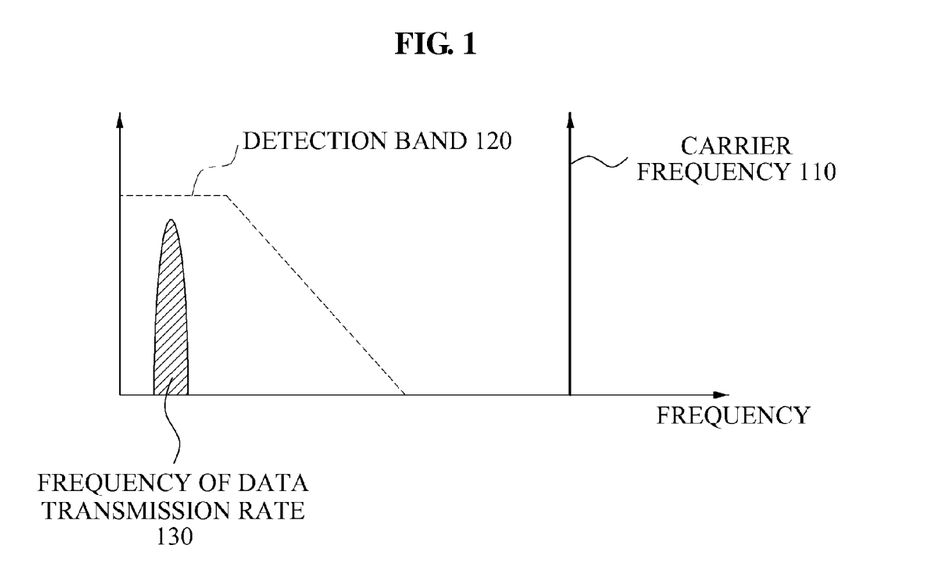
FIG. 1 is a graph illustrating an example of a carrier frequency, a detection band of an envelope detector, and a frequency of a data transmission rate.

FIG. 1 illustrates an example of a carrier frequency 110, a detection band 120 of an envelope detector, and a frequency 130 of a data transmission rate. The carrier frequency 110 is greater than the detection band 120 and the frequency 130.

In an electronic system including a communication system, a frequency of a data transmission rate is less than a carrier frequency. For example, referring to FIG. 1, the carrier frequency 110 is about 5 to 10 times greater than the detection band 120 of the envelope detector, and about 100 times or more greater than the frequency 130 of the data transmission rate.

However, if the frequency 130 of the data transmission rate is increased, a difference between the frequency 130 and the detection band 120 of the envelope detector is decreased, which may decrease an efficiency of the envelope detector. If a bandwidth of the detection band 120 is increased to decrease data distortion caused by the reduction in the difference between the frequency 130 and the detection band 120, a difference between the carrier frequency 110 and the detection band 120 may not be sufficiently large. If a small input signal is input into the envelope detector in this state, carrier frequency components remaining in an output node of the envelope detector may affect determination of data in a form of noise. If the bandwidth of the detection band 120 is decreased in order to decrease the remaining carrier frequency components, and a large input signal is input into the envelope detector, the output node of the envelope detector may be distorted due to an insufficient slew rate of the envelope detector.

Therefore, adaptive control of the detection band 120, the bandwidth of the detection band 120, the slew rate, and/or other properties of the envelope detector may be performed. A change in the detection band 120 may influence the bandwidth and the slew rate. Accordingly, hereinafter, determining and controlling of a detection band of an envelope detector will be understood to include determining and controlling of a bandwidth of the detection band and a slew rate, of the envelope detector.

Figure 2:
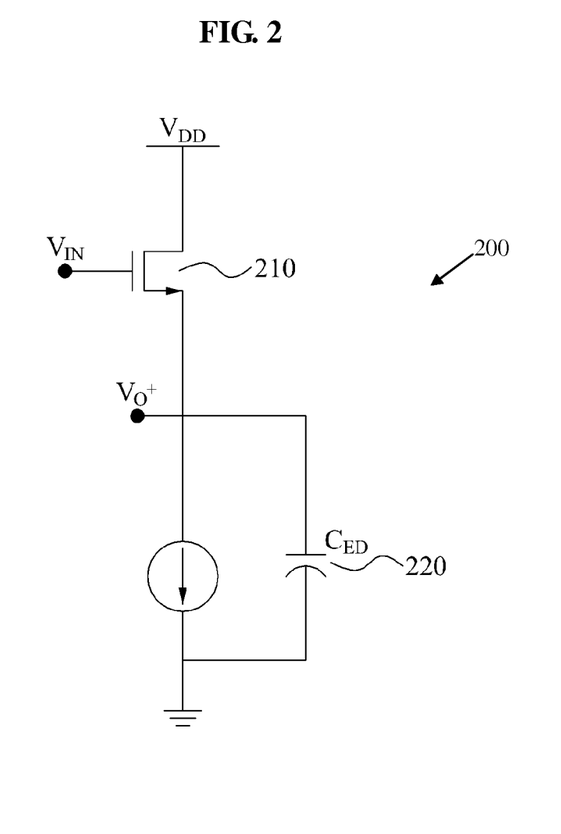
FIG. 2 is a diagram illustrating an example of an envelope detector including a n-channel metal oxide semiconductor (NMOS) transistor, a current source, and a capacitor.

FIG. 2 illustrates an example of an envelope detector 200 including a n-channel metal oxide semiconductor (NMOS) transistor 210, a current source, and a capacitor 220. Although the envelope detector 200 in the example of FIG. 2 includes the NMOS transistor 210, other transistors may be used, such as a p-channel MOS (PMOS) transistor and/or any other transistor known to one of ordinary skill in the art. A power supply signal $V_{DD}$ is applied to an input node (i.e., a drain node) of the NMOS transistor 210. The current source is connected to an output node (i.e., a source node) of the NMOS transistor 210, and is connected to ground. The capacitor 220 includes a capacitance $C_{ED}$, and is connected in parallel to the current source.

A detection band of the envelope detector 200 and a bandwidth of the detection band (e.g., a detection bandwidth) is determined based on a transconductance of the NMOS transistor 210 and the capacitor 220. When an input signal $V_{IN}$ is applied to a gate of the NMOS transistor 210, the envelope detector 200 low-pass filters the input signal $V_{IN}$ based on the detection band and the detection bandwidth. Accordingly, the envelope detector 200 outputs an output signal $V_O^+$ including an envelope of the input signal $V_{IN}$ at the output node (i.e., a source node) of the NMOS transistor 210.

Figure 3:
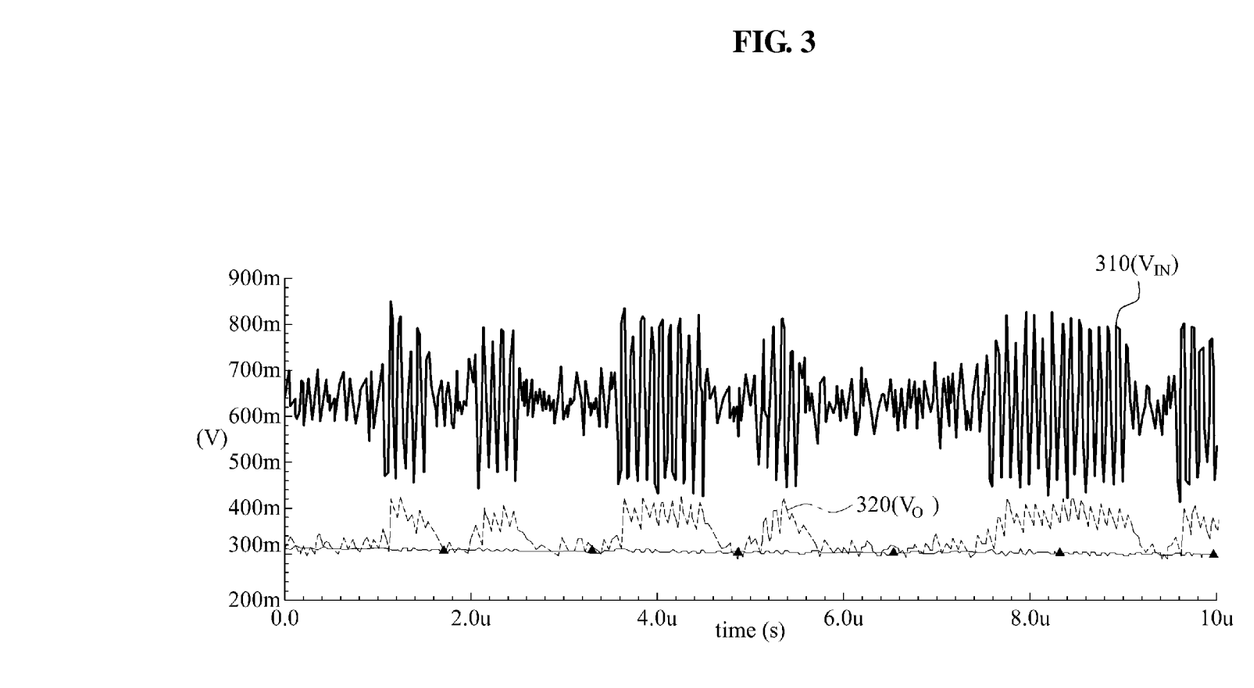
FIG. 3 is a graph illustrating an example of an input waveform and an output waveform of an envelope detector.

FIG. 3 illustrates an example of an input waveform 310 and an output waveform 320 of an envelope detector, e.g., the envelope detector 200 shown in FIG. 2. Referring to FIG. 3, as the input waveform 310 of an input signal $V_{IN}$ passes through the envelope detector, the envelope detector outputs the output waveform 320 of an output signal $V_O^+$ at an output node. Each of the input waveform 310 and the output waveform 320 includes a voltage waveform over time.

Figure 4:
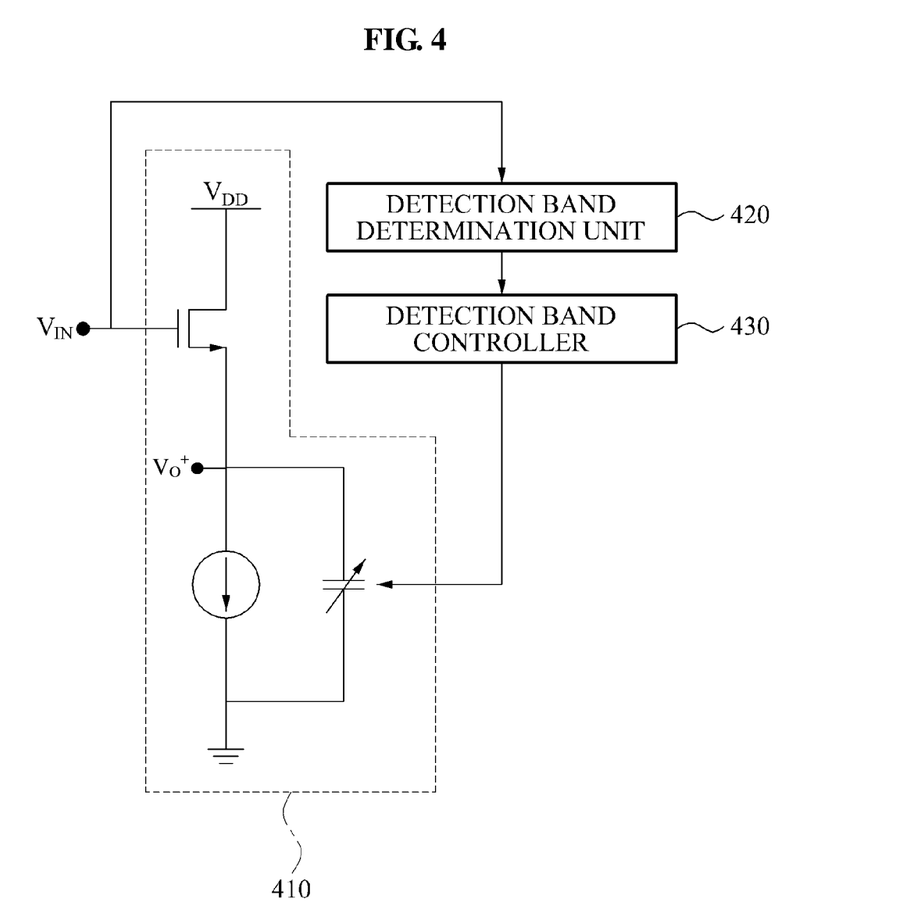
FIG. 4 is a diagram illustrating an example of an envelope detection apparatus dynamically controlling a capacitor of an envelope detector.

FIG. 4 illustrates an example of an envelope detection apparatus dynamically controlling a capacitor of an envelope detector 410. In more detail, the envelope detection apparatus controls a detection band of the envelope detector based on at least one property of an input signal to obtain an output signal of the envelope detector, i.e., an envelope of the input signal. To control the detection band, the envelope detection apparatus controls a bandwidth of the detection band (i.e., a detection bandwidth), and a slew rate of the envelope detector.

Referring to FIG. 4, the envelope detection apparatus includes the envelope detector 410, a detection band determination unit 420, and a detection band controller 430. The envelope detector 410 receives the input signal $V_{IN}$, and outputs the output signal $V_O^+$ including the envelope of the input signal $V_{IN}$ in response to the input signal $V_{IN}$. The envelope detector 410 includes a NMOS transistor receiving the input signal $V_{IN}$, a current source, and the capacitor. The current source and the capacitor are electrically connected to a source node of the transistor to output the envelope of the input signal $V_{IN}$. The current source and the capacitor are connected in parallel. Although the envelope detector 410 in the example of FIG. 4 includes the NMOS transistor, other transistors may be used, such as a PMOS transistor and/or any other transistor known to one of ordinary skill in the art. Even if another transistor is used, an equivalent circuit of an envelope detector may be implemented by the envelope detector 410 shown in FIG. 4.

The detection band determination unit 420 receives the input signal $V_{IN}$, and determines a detection band in response to the input signal $V_{IN}$. The determination of the detection band includes determination of a detection bandwidth of the detection band, and a slew rate. The determined detection band may correspond to an optimal detection band used to detect the envelope of the input signal $V_{IN}$ while minimizing data distortion and carrier frequency components caused by the input signal $V_{IN}$.

For example, the detection band determination unit 420 may determine the detection band based on a carrier frequency, a data transmission rate, and/or a magnitude of the input signal $V_{IN}$. The detection band determination unit 420 may determine the detection band to dynamically increase and decrease the actual detection band of the envelope detector 410 based on at least one of the abovementioned properties of the input signal $V_{IN}$.

The detection band controller 430 generates a control signal to be provided to the envelope detector 410 to control the detection band of the envelope detector 410 based on the determined detection band. For example, the detection band controller 430 may control the current source or the capacitor of the envelope detector 410 based on the determined detection band. In the example of FIG. 4, the capacitor is controlled. In other words, the detection band controller 430 sets (i.e., increases or decreases) the detection band of the envelope detector 410 to be approximately equal to the determined detection band.

If the detection bandwidth of the detection band of the envelope detector 410 is to be decreased based on the determined detection band or bandwidth, the detection band controller 430 generates the control signal to increase an effective capacitance of the capacitor. If the detection bandwidth of the detection band of the envelope detector 410 is to be increased based on the determined detection band or bandwidth, the detection band controller 430 generates the control signal to decrease the effective capacitance of the capacitor.

Various methods may be applied to dynamically control the effective capacitance of the capacitor. For example, according to a method illustrated in FIG. 5, to dynamically control the effective capacitance a portion of sub capacitors is dynamically switched. However, other methods may be used, and the scope of the examples is not limited thereto.

If the magnitude of the input signal $V_{IN}$ is small, carrier frequency components may affect an output node of the envelope detector 410 (i.e., the source node of the transistor) as a noise. In this example, the detection band determination unit 420 may determine the detection band to decrease the actual detection band of the envelope detector 410 or the detection bandwidth of the actual detection band. To decrease the actual detection band or the detection bandwidth, the detection band controller 430 may generate the control signal to increase the effective capacitance of the capacitor. Therefore, the carrier frequency components may be suppressed at the output node, thereby aiding in accurate demodulation of data.

Conversely, if the magnitude of the input signal $V_{IN}$ is large, the output signal $V_O^+$ may be distorted due to the slew rate of the envelope detector 410. In this example, the detection band determination unit 420 may determine the detection band to increase the actual detection band of the envelope detector 410 or the detection bandwidth of the actual detection band. For this purpose, the detection band controller 430 may generate the control signal to decrease the effective capacitance of the capacitor. Thus, the slew rate may be increased, and accurate data demodulation may be achieved.

Figure 5:
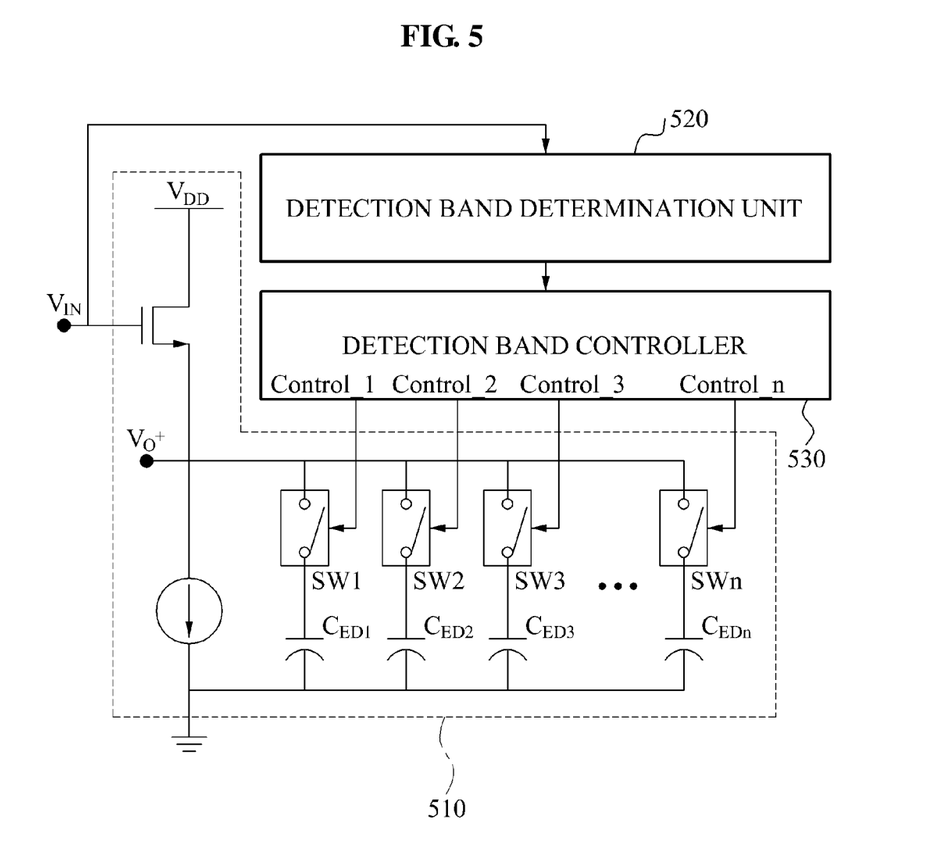
FIG. 5 is a diagram illustrating an example of an envelope detection apparatus including an envelope detector equipped with sub capacitors and switches.

FIG. 5 illustrates an example of an envelope detection apparatus including an envelope detector 510 equipped with sub capacitors and switches. The envelope detection apparatus further includes a detection band determination unit 520 and a detection band controller 530.

The envelope detector 510 includes the sub capacitors $C_{ED1}$, $C_{ED2}$, $C_{ED3}$, ..., and $C_{EDn}$ and switches SW1, SW2, SW3, ..., SWn. Each of the sub capacitors $C_{ED1}$, $C_{ED2}$, $C_{ED3}$, ..., and $C_{EDn}$ is serially connected to each of the switches SW1, SW2, SW3, ..., SWn, respectively. Respective pairs of the sub capacitors and the switches are connected in parallel. The envelope detector 510 and the detection band determination unit 520 may perform functions similar to those of the envelope detector 410 and the detection band determination unit 420 of FIG. 4, and thus, description of such functions is omitted for increased conciseness.

Referring to FIG. 5, the detection band controller 530 generates at least one control signal (e.g., a control signal 1, a control signal 2, a control signal 3, ..., and/or a control signal n) to select at least one sub capacitor, respectively, from the sub capacitors $C_{ED1}$, $C_{ED2}$, $C_{ED3}$, ..., and $C_{EDn}$ based on a detection band determined by the detection band determination unit 520. The selected sub capacitor is switched ON, while non-selected sub capacitors are switched OFF.

That is, the detection band controller 530 generates the control signal to selectively switch ON at least one switch, respectively, of the switches SW1, SW2, SW3, ..., SWn based on the determined detection band. For example, a switch corresponding to a large sub capacitor may be switched ON to increase an actual detection band of the envelope detector 510 or a bandwidth of the actual detection band. A switch corresponding to a small sub capacitor may be switched ON to increase a slew rate of the envelope detector 510. Furthermore, at least two switches may be selectively switched ON. In this example, an effective capacitance of the envelope detector 510 may be variably set.

Figure 6:
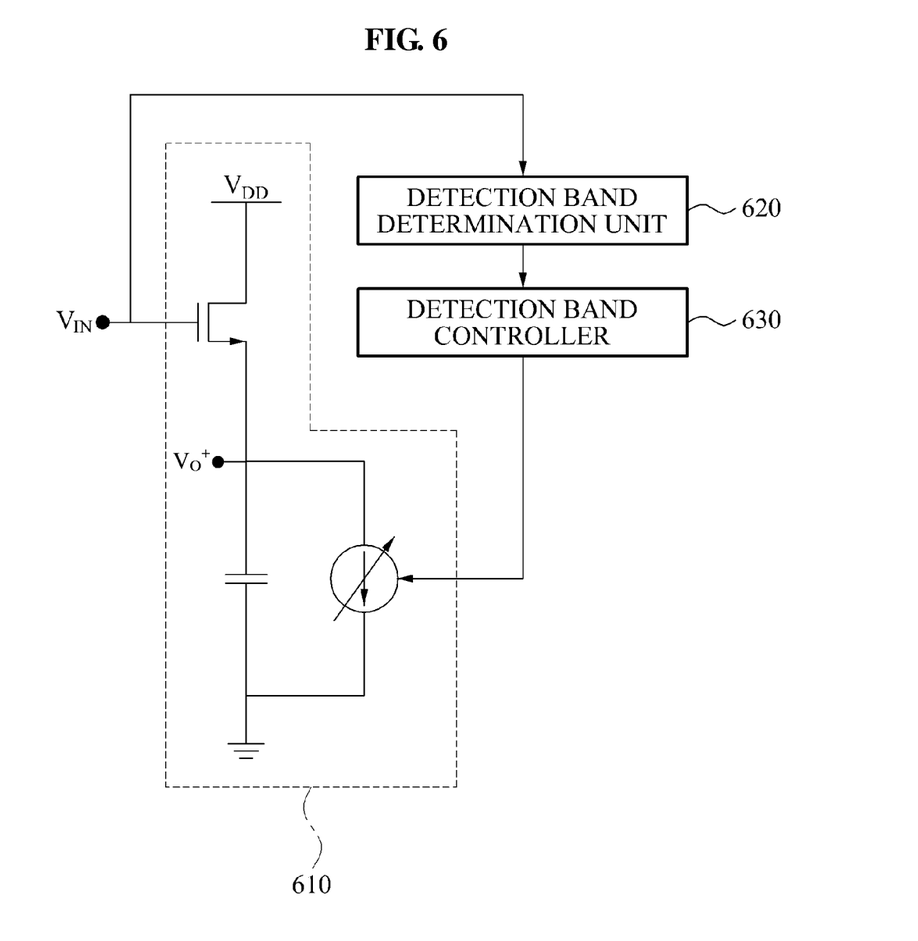
FIG. 6 is a diagram illustrating an example of an envelope detection apparatus dynamically controlling a current source of an envelope detector.

FIG. 6 illustrates an example of an envelope detection apparatus dynamically controlling a current source of an envelope detector 610. The envelope detection apparatus includes the envelope detector 610, a detection band determination unit 620, and a detection band controller 630.

The envelope detector 610 receives an input signal $V_{IN}$, and outputs an output signal $V_O^+$ including an envelope of the input signal $V_{IN}$ in response to the input signal $V_{IN}$. The envelope detector 610 includes a NMOS transistor receiving the input signal $V_{IN}$, the current source, and a capacitor. The current source and the capacitor are electrically connected to a source node of the transistor to output the envelope of the input signal $V_{IN}$. The current source and the capacitor are connected in parallel. Although the envelope detector 610 in the example of FIG. 6 includes the NMOS transistor, other transistors may be used, such as a PMOS transistor and/or any other transistor known to one of ordinary skill in the art. Even if another transistor is used, an equivalent circuit of an envelope detector may be implemented by the envelope detector 610 shown in FIG. 6.

The detection band determination unit 620 determines a detection band in response to the input signal $V_{IN}$. The determination of the detection band includes determination of a bandwidth of the detection band (i.e., a detection bandwidth) and a slew rate.

The detection band controller 630 generates a control signal to be provided to the envelope detector 610 to control the detection band of the envelope detector 610 based on the determined detection band. The detection band controller 630 may control the current source or the capacitor of the envelope detector 610 based on the determined detection band. In the example of FIG. 6, the current source is controlled. In other words, the detection band controller 630 sets (i.e., increases or decreases) the detection band of the envelope detector 610 to be approximately equal to the determined detection band.

If a bandwidth of the detection band (i.e., the detection bandwidth) of the envelope detector 610 is to be decreased based on the determined detection band or bandwidth, the detection band controller 630 generates the control signal to decrease an effective current of the current source. If the detection bandwidth of the detection band of the envelope detector 610 is to be increased based on the determined detection band or bandwidth, the detection band controller 630 generates the control signal to increase the effective current of the current source.

In addition, if a slew rate of the envelope detector 610 is to be increased based on the determined detection band or slew rate, the detection band controller 630 generates the control signal to increase the effective current of the current source. Conversely, if the slew rate of the envelope detector 610 is to be decreased based on the determined detection band or slew rate, the detection band controller 630 generates the control signal to decrease the effective current of the current source.

Figure 7:
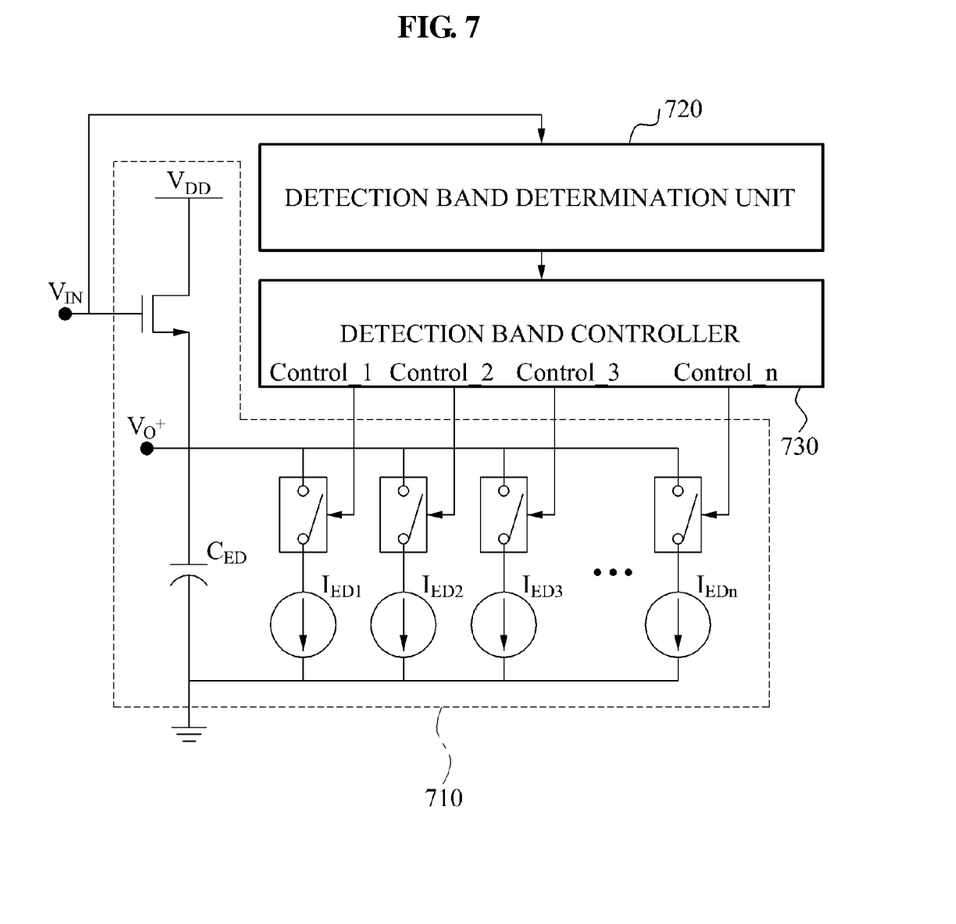
FIG. 7 is a diagram illustrating an example of an envelope detection apparatus including an envelope detector equipped with sub current sources and switches.

FIG. 7 illustrates an envelope detection apparatus including an envelope detector 710 equipped with sub current sources and switches. The envelope detection apparatus further includes a detection band determination unit 720 and a detection band controller 730.

The envelope detector 710 includes the sub current sources $I_{ED1}$, $I_{ED2}$, $I_{ED3}$, ..., and $I_{EDn}$ and the switches. Each of the sub current sources $I_{ED1}$, $I_{ED2}$, $I_{ED3}$, ..., and $I_{EDn}$ is serially connected to each of the switches, respectively. Respective pairs of the sub current sources and the switches are connected in parallel. The envelope detector 710 and the detection band determination unit 720 may perform functions similar to those of the envelope detector 610 and the detection band determination unit 620 of FIG. 6, and thus, description of such functions is omitted for increased conciseness.

Referring to FIG. 7, the detection band controller 730 generates at least one control signal (e.g., a control signal 1, a control signal 2, a control signal 3, ..., and/or a control signal n) to select at least one sub current source, respectively, from the sub current sources $I_{ED1}$, $I_{ED2}$, $I_{ED3}$, ..., and $I_{EDn}$ based on a detection band of the envelope detector 710 determined by the detection band determination unit 720. The selected sub current source is switched ON, while non-selected sub current sources are switched OFF.

That is, the detection band controller 730 generates the control signal to selectively switch ON at least one switch, respectively, of the switches based on the determined detection band. For example, a switch corresponding to a small sub current source may be switched ON to decrease an actual detection band of the envelope detector 710 or a bandwidth of the actual detection band. A switch corresponding to a large sub current source may be switched ON to increase a slew rate of the envelope detector 710. Furthermore, at least two switches may be selectively switched ON, and an effective current of the envelope detector 710 may be variably set.

Operations of the above-described envelope detection apparatus may be methodically implemented. Furthermore, a method of configuring the envelope detection apparatuses illustrated in FIGS. 1 through 7 may be included in the scope of the examples.

The units described herein may be implemented using hardware components and software components. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. For example, the software and data may be stored by one or more computer readable recording mediums. The computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments accomplishing the examples disclosed herein can be easily construed by programmers skilled in the art to which the examples pertain based on and using the flow diagrams and block diagrams of the figures and their corresponding descriptions as provided herein.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An envelope detection apparatus comprising:
an envelope detector configured to output an envelope of an input signal;
a detection band determination unit configured to determine a detection frequency band based on the input signal; and
a detection band controller configured to adaptively adjust an effective current of a current source or an effective capacitance of a capacitor to selectively control a detection frequency band of the envelope detector based on the determined detection frequency band of the input signal.

2. The envelope detection apparatus of claim 1, wherein the detection band controller is configured to:
generate a control signal to be provided to the envelope detector to control the detection frequency band of the envelope detector based on the determined detection frequency band.

3. The envelope detection apparatus of claim 1, wherein:
the envelope detector comprises
a current source, and
a capacitor; and
the detection band controller is configured to generate a control signal to control an effective current of the current source and an effective capacitance of the capacitor based on the determined detection frequency band to exclude carrier frequency component noise of a predetermined data transmission.

4. The envelope detection apparatus of claim 1, wherein:
the envelope detector comprises
a transistor configured to receive the input signal,
a current source, and
a capacitor;
the current source and the capacitor are connected to a node of the transistor to output the envelope; and
the current source and the capacitor are connected in parallel.

5. The envelope detection apparatus of claim 4, wherein:
the capacitor comprises sub capacitors connected in parallel; and
the detection band controller is configured to generate a control signal to select at least one sub capacitor from the sub capacitors based on the determined detection frequency band.

6. The envelope detection apparatus of claim 5, wherein:
the at least one sub capacitor is switched ON; and
remaining sub capacitors of the sub capacitors are switched OFF.

7. The envelope detection apparatus of claim 4, wherein:
the current source comprises sub current sources connected in parallel; and
the detection band controller is configured to generate a control signal to select at least one sub current source from the sub current sources based on the determined detection frequency band.

8. The envelope detection apparatus of claim 7, wherein:
the at least one sub current source is switched ON; and
remaining sub current sources of the sub current sources are switched OFF.

9. The envelope detection apparatus of claim 4, wherein the detection band controller is configured to:
generate a control signal to increase an effective capacitance of the capacitor, or to decrease an effective current of the current source, if a frequency bandwidth of the detection frequency band is to be decreased based on the determined detection frequency band.

10. The envelope detection apparatus of claim 4, wherein the detection band controller is configured to:
generate a control signal to decrease an effective capacitance of the capacitor, or to increase an effective current of the current source, if a frequency bandwidth of the detection frequency band of the envelope detector is to be increased based on the determined detection frequency band.

11. The envelope detection apparatus of claim 4, wherein the detection band controller is configured to:
generate a control signal to increase an effective current of the current source if a slew rate of the envelope detector is to be increased based on the determined detection frequency band.

12. The envelope detection apparatus of claim 4, wherein the detection band controller is configured to:
generate a control signal to decrease an effective current of the current source if a slew rate of the envelope detector is to be decreased based on the determined detection frequency band.

13. The envelope detection apparatus of claim 1, wherein the detection band determination unit is configured to:
determine the detection frequency band based on a carrier frequency of the input signal, or a frequency of a data transmission rate of the input signal, or a magnitude of the input signal, or any combination thereof.

14. The envelope detection apparatus of claim 1, wherein the detection band determination unit is configured to:
determine the detection frequency band to decrease the detection frequency band of the envelope detector if a magnitude of the input signal is small.

15. The envelope detection apparatus of claim 1, wherein the detection band determination unit is configured to:
determine the detection frequency band to increase the detection frequency band of the envelope detector if a magnitude of the input signal is large.

16. An envelope detection apparatus comprising:
an envelope detector comprising
a transistor configured to receive an input signal,
a current source, and
a capacitor, the current source and the capacitor being connected to a node of
the transistor to output an envelope of the input signal;
a detection band determination unit configured to determine a detection frequency band based on the input signal; and
a detection band controller configured to generate a control signal to adaptively adjust an effective current of the current source or an effective capacitance of the capacitor in order to selectively control a detection frequency band of the envelope detector based on the determined detection frequency band of the received input signal.

17. The envelope detection apparatus of claim 16, wherein:
the transistor comprises a n-channel metal oxide semiconductor (NMOS) transistor;
the current source and the capacitor are connected to a source node of the NMOS transistor; and
the envelope comprises a voltage signal at the source node.

18. The envelope detection apparatus of claim 16, wherein:
the current source comprises
sub current sources, and
switches, each of the sub current sources being serially connected with each of the switches, respectively, and respective pairs of the sub current sources and the switches being connected in parallel; and the detection band controller is configured to generate the control signal to selectively switch ON at least one switch of the switches based on the determined detection frequency band.

19. The envelope detection apparatus of claim 16, wherein:

the capacitor comprises sub capacitors, and switches, each of the sub capacitor being serially connected with each of the switches, respectively, and respective pairs of the sub capacitors and the switches being connected in parallel; and the detection band controller is configured to generate the control signal to selectively switch ON at least one switch of the switches based on the determined detection frequency band.

20. The envelope detection apparatus of claim 16, wherein the detection band determination unit is configured to:

determine the detection frequency band based on a carrier frequency of the input signal, or a frequency of a data transmission rate of the input signal, or a magnitude of the input signal, or any combination thereof.

21. The envelope detection apparatus of claim 1, wherein the detection band controller is configured to dynamically increase and decrease the detection frequency band of the envelope detector based on properties of the input signal.

22. The envelope detection apparatus of claim 1, wherein the detection band controller is configured to increase and decrease the detection frequency band of the envelope detector to be approximately equal to the determined detection frequency band.

\* \* \* \* \*